(12) United States Patent
Tomsio et al.

(10) Patent No.: US 6,737,749 B2
(45) Date of Patent: May 18, 2004

(54) RESISTIVE VIAS FOR CONTROLLING IMPEDANCE AND TERMINATING I/O SIGNALS AT THE PACKAGE LEVEL

(75) Inventors: Nayon Tomsio, Austin, TX (US); Avi Liebermensch, Cupertino, CA (US)

(73) Assignee: Sun Microsystems, Inc., Sunnyvale, CA (US)

( * ) Notice: Subject to any disclaimer, the term of this patent is extended or adjusted under 35 U.S.C. 154(b) by 0 days.

(21) Appl. No.: 10/028,814

(22) Filed: Dec. 20, 2001

(65) Prior Publication Data

US 2003/0116856 A1 Jun. 26, 2003

(51) Int. Cl.[7] .................. H01L 29/00; H01L 23/48; H01L 23/52; H01L 23/053; H01L 23/12; H01L 29/40
(52) U.S. Cl. ............... 257/774; 257/528; 257/537; 257/758; 257/773; 257/776; 257/767; 257/690; 257/700; 257/664
(58) Field of Search ................... 257/536, 537, 257/528, 758, 774, 773, 776, 767, 690, 700, 664

(56) References Cited

U.S. PATENT DOCUMENTS

| | | | |
|---|---|---|---|
| 3,210,831 A | 10/1965 | Johnson et al. | |
| 4,179,797 A | 12/1979 | Johnson | |
| 4,300,115 A | * 11/1981 | Ansell et al. | ................ 338/314 |
| 5,164,699 A | * 11/1992 | Smith et al. | ................ 338/310 |
| 5,766,670 A | 6/1998 | Arldt et al. | |
| 5,808,478 A | 9/1998 | Andresen | |
| 5,898,321 A | 4/1999 | Ilkbahar et al. | |
| 6,100,787 A | 8/2000 | Huang et al. | |
| 6,115,298 A | 9/2000 | Kwon et al. | |
| 6,130,601 A | 10/2000 | Brown et al. | |
| 6,150,615 A | * 11/2000 | Suzuki | ....................... 174/260 |
| 6,246,312 B1 | 6/2001 | Poole et al. | |
| 6,621,012 B2 | * 9/2003 | Crockett et al. | ............ 174/261 |
| 2002/0022110 A1 | * 2/2002 | Barr et al. | ................... 428/137 |

FOREIGN PATENT DOCUMENTS

WO   WO0231867   * 7/2002   .......... H01L/21/02

OTHER PUBLICATIONS

*The Effects of Vias on PCB Traces*, Design Note, UltraCAD Design, Inc., 1994.

* cited by examiner

Primary Examiner—Nathan J. Flynn
Assistant Examiner—Victor A. Mandala, Jr.
(74) Attorney, Agent, or Firm—Zagorin, O'Brien & Graham, LLP

(57) ABSTRACT

A circuit package and a method of forming the same that facilitates control of the impedance of a driving circuit employing resistive vias formed into a dielectric substrate.

33 Claims, 3 Drawing Sheets

RESISTIVE VIAS FOR CONTROLLING IMPEDANCE AND TERMINATING I/O SIGNALS AT THE PACKAGE LEVEL

BACKGROUND OF THE INVENTION

Circuit package designs are utilizing higher operational frequencies to satisfy data rate increases of integrated circuits. As a result, package designs must address challenges to signal propagation presented by the increased operational frequencies that were previously ignored, such as distributed resistance and capacitance (RC) of the conductor, an impedance of the driving source and load impedance. Specifically, for very long conductors, i.e., conductors whose length is great compared to the wavelength of a signal, the RC of the conductor produces propagation delays, as well as contributes to impedance mismatches. Impedance mismatch between the driving source and the conductor results in signal reflection, which interferes with signals produced by the driving circuit, typically referred to as return loss. Return loss results in both noise and shape degradation in signals produced by the driving circuit.

To avoid impedance mismatch, packages may be designed with discrete resistors to define the impedances of the signal lines connected to the driving receiving circuit. Typically, these discrete resistors are formed by printing, such as screen printing, a thick-film resistive paste or ink on a substrate and are referred to as thick-film resistors. The predictability and variability (or tolerance) of the electrical resistance of a thick-film resistor has proved challenging.

As a result, circuit package design typically has depended upon integrated circuit design to solve the problems presented by high frequency signal propagation. For example, U.S. Pat. No. 6,115,298 to Kwon et al. discloses a semiconductor device that includes a circuit to reduce impedance mismatch between the semiconductor device and a bus connected thereto. The bus consists of a plurality of signal lines. The semiconductor device includes a discrete resistor, corresponding to the impedance of the signal lines. The signal lines are connected to a plurality of second pads. A reference voltage generator generates a reference voltage. A comparator compares a voltage on the first pad with the reference voltage, generating a control signal in response to the comparison. A code generator generates a code signal in accordance with the control signal to produce a current on the first pad. A data driver drives data signals to the code signal, thereby matching the impedance of the data driver with the impedance of the signal lines.

U.S. Pat. No. 5,808,478 to Andresen discloses a buffer with a slew rate that is load independent. The buffer is comprised of an output buffer connected to an output terminal. The output buffer is controlled such that it can drive a load with different drive levels by changing the transconductance internal thereto. The transition on the input to the buffer is passed through an intrinsic delay block to provide a delay signal on a node. A first phase detector latch with a first threshold voltage compares this transition with the transition on the output terminal. A second phase detector latch with a second threshold voltage, also compares this delayed transition with that on the output terminal. If both of the latches indicate that the delayed transition occurred after the transition on the output terminal, a control signal on a line is changed by incrementing a counter. This will change the drive to a load. If the transition on the output terminal occurs after the delayed transition, then the counter increments the count value in the opposite direction, increasing the drive to the load to increase the speed of the output driver.

What is needed, however, is a circuit package design that minimizes impedance mismatch between the driving source and the conductor.

SUMMARY OF THE INVENTION

Provided is a circuit package and a method of forming the same that facilitates control of the impedance of a driving circuit employing resistive vias formed into a dielectric substrate. In this manner, the input impedance, output impedance or both of the driving circuit may more closely match the impedance of the conductor, or transmission line, of a package that is connected thereto. To that end, the package includes a dielectric substrate having a first surface and a second surface, disposed opposite to the first surface. A via extends between the first and second surface, and a first conductor is disposed on the surface that extends from the via. A second conductor is disposed on the second surface and extends from the via. The via has a resistive fill disposed therein, defining a resistance connected between the first and second conductors. A driver circuit is mounted to the substrate and includes an input and an output. The output is in electrical communication with the first conductor and has an output impedance associated therewith. The output impedance includes an output resistive component and an output reactance component. The output resistive component including the resistance, and the resistance is of sufficient magnitude to be the dominant component of the output impedance. In another embodiment, the impedance of the input is controlled in a similar fashion. The method defines steps to make the aforementioned circuit.

DETAILED DESCRIPTION OF THE INVENTION

Figure 1:
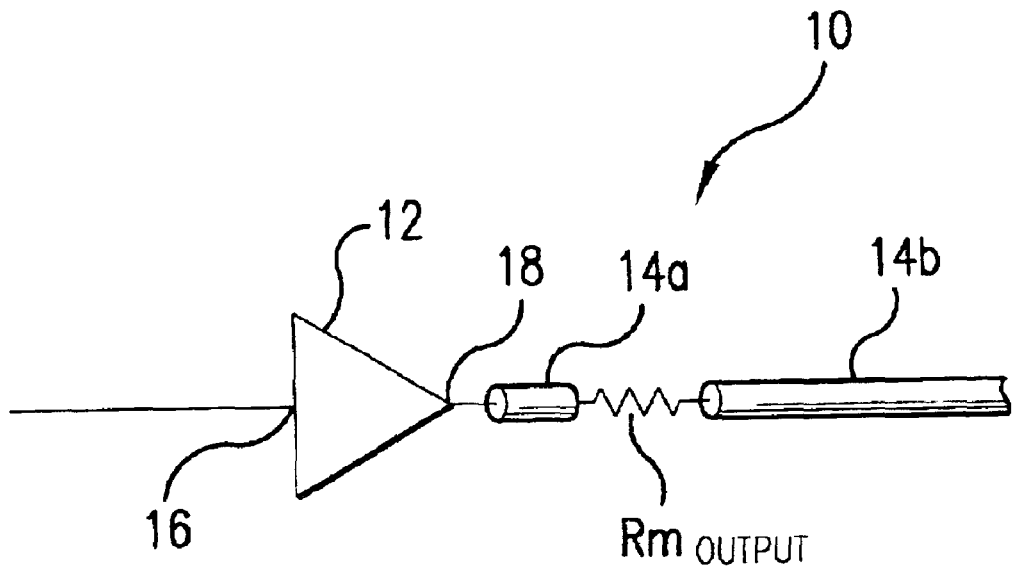
FIG. 1 is a schematic illustrating the structure of the circuit in accordance with the prior art.

Referring to FIG. 1 a prior art circuit 10 is shown including a driver circuit 12 connected to a conductor, or transmission line, shown as line segments 14a and 14b and an output match resistor $Rm_{output}$ connected to the transmission line proximate to output 18. Driver circuit 12, in this example, is a buffer with an input 16 and an output 18. In this first implementation, output match resistor $Rm_{output}$ is connected to both output 18 and transmission line, with the transmission line including line segments 14a and 14b. Output match resistor $Rm_{output}$ is employed to ensure that the impedance of output 18 closely matches the impedance of the transmission line, for a given operational frequency of circuit 10. Specifically, the output impedance $R_{TOTALDRIVER}$ associated with driving circuit 12 may be defined as follows:

$$R_{TOTALDRIVER} = Rm_{OUTPUT} + R_{DRIVER} \qquad 1.$$

where $R_{DRIVER}$ is the output resistance at output 18.

Varying the value of $R_{DRIVER}$ is the most efficient manner by which to adjust $R_{TOTALDRIVER}$. However, adjusting $R_{DRIVER}$ internal to driving circuit 12 is problematic for several reasons. Firstly, silicon process control, effective voltage at transitors, and temperature makes it extremely difficult to determine the magnitude of $R_{DRIVER}$, since $R_{DRIVER}$ could vary 50% or even more. In addition, driving circuit 12 is typically an off-the-shelf item that is already fabricated, affording very little opportunity to modify the resistive component of the output impedance when being implemented in a package design. The presence of output match resistor $Rm_{output}$ facilitates control of the value $R_{TOTALDRIVER}$. Furthermore, the presence of line segment 14a may eliminate any benefit of using $Rm_{output}$ if line segment 14a is long enough to be a transmission by introducing reflections caused by impedance mismatches.

Figure 2:
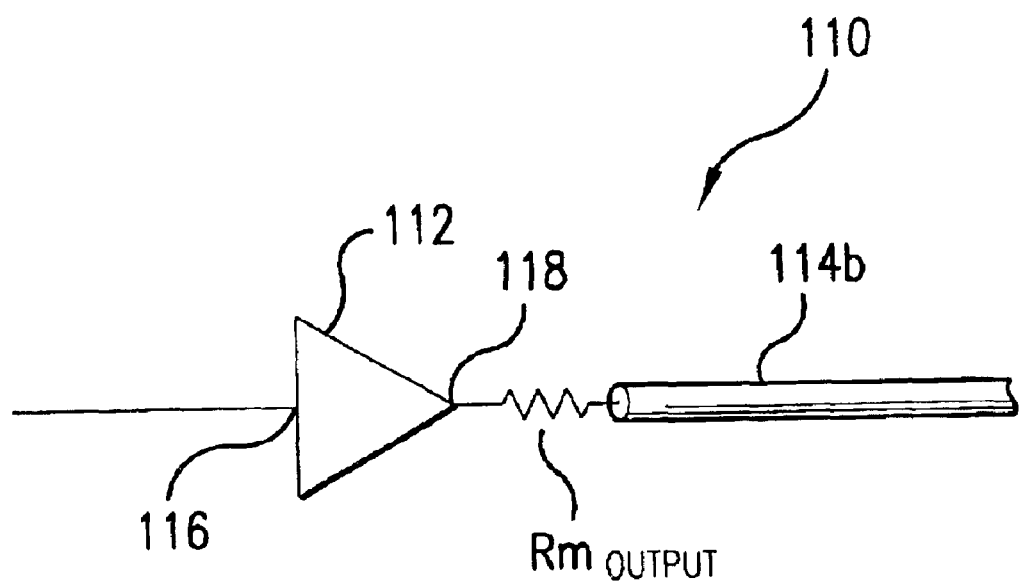
FIG. 2 is a schematic illustrating the structure of the circuit in accordance with the present invention.

Referring to FIG. 2, to accurately control the impedance of output 118, output match resistor $Rm_{output}$ is preferably coupled to the transmission line proximate to output 118. To that end, the connection between $Rm_{output}$ is made proximate to output 118 so that the impedance attributable to transmission line segment 14a, shown in FIG. 1, is abrogated. As a result circuit 110, of FIG. 2, has output 118 directly connected to $Rm_{output}$, with the opposing end of $Rm_{output}$ being connected to transmission line segment 114b. To further improve impedance matching, magnitude of the resistance of match resistor is selected so that it becomes the dominant component of term for $R_{TOTALDRIVER}$ and ensures an impedance match between output 118 and the transmission line. To that end, and in accordance with the present invention, the relationship between $Rm_{output}$ and $R_{DRIVER}$ being defined as follows:

$$Rm_{output} > R_{DRIVER} \qquad 2.$$

In this manner, the impedance of output 118 may be closely matched, within very tight tolerances, to the impedance of the transmission line that is defined by line segment 114b. Exemplary resistance values for $R_{DRIVER}$ are in a range of 5 to 12 ohms, inclusive. Output match resistor $Rm_{output}$ has a value that is no less than twice the value of $R_{DRIVER}$ and is typically in a range of 35 to 50 ohms, inclusive.

Figure 3:
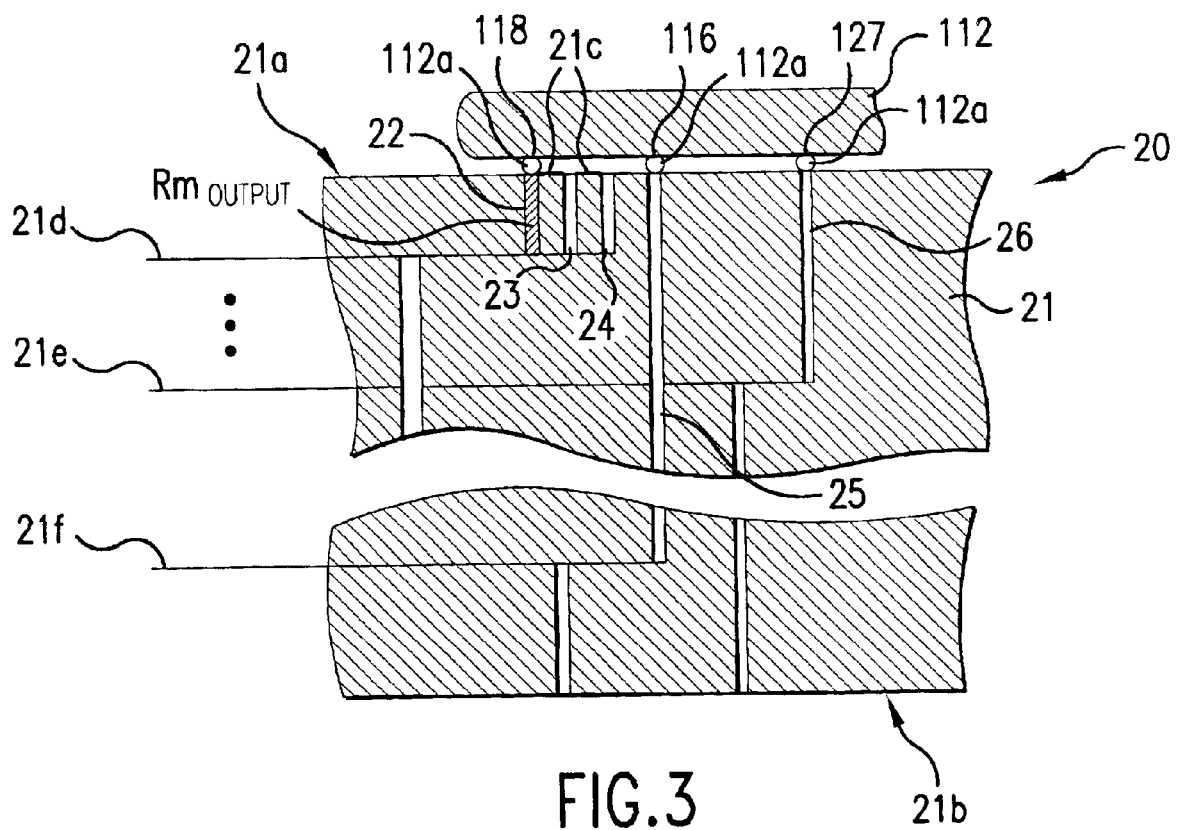
FIG. 3 is a cross-sectional view showing the circuit of FIG. 2 implemented in a circuit package in accordance with the present invention.

Referring to FIG. 3, implementing circuit 110 in a package 20, however, poses certain challenges in obtaining an accurate value of output match resistor $Rm_{output}$ due to the limitations of thick-film technology as set forth above. As shown, package 20 includes a dielectric substrate, or body 21, having a first surface 21a and a second surface 21b, disposed opposite to first surface 21a. Driver circuit 112 is coupled to conductive traces 21c on surface 21a employing conductive bumps, 112a, typically employed in flip-chip attachment techniques. Located between first and second surfaces 21a and 21b are a plurality of spaced-apart and parallel conducting planes, shown as 21d, 21e and 21f contained therein with vias 22, 23, 24, 25 and 26 extending from a surface of dielectric body 21a down to differing conducting layers 21d, 21e and 21f. These conducting layers may serve any function desired, such as power, ground or signal lines. For purposes of the present discussion, conducting planes 21d, 21e and 21f are discussed with the function of a signal transmission line. To improve the impedance match between output 118 and one of the transmission lines, in this example conducting layer 21a, output match resistor $Rm_{output}$ is formed by filling via 22 with a resistive material. Via 22 is selected to be spatially more proximate to output 118, compared to the remaining vias, e.g., vias 23 and 24. In this manner, the value of the resistance of output match resistor $Rm_{output}$ may be ensured to comprise the dominant components of the impedance at region of circuit 110 where output match resistor output is present. This enables concurrently establishing an output resistance component of $R_{TOTALDRIVER}$ and matching the characteristic impedance of the transmission line $Z_0$. In this manner, the impedance of output 118, $R_{TOTALDRIVER}$, is made to closely match the impedance of transmission line, $Z_0$.

Figure 4:
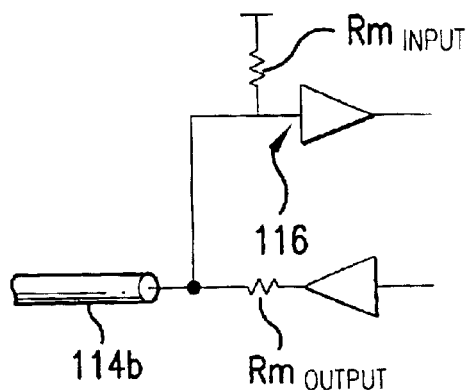
FIG. 4 is a schematic illustrating the structure of the circuit in accordance with an alternate embodiment of the present invention.
Figure 5:
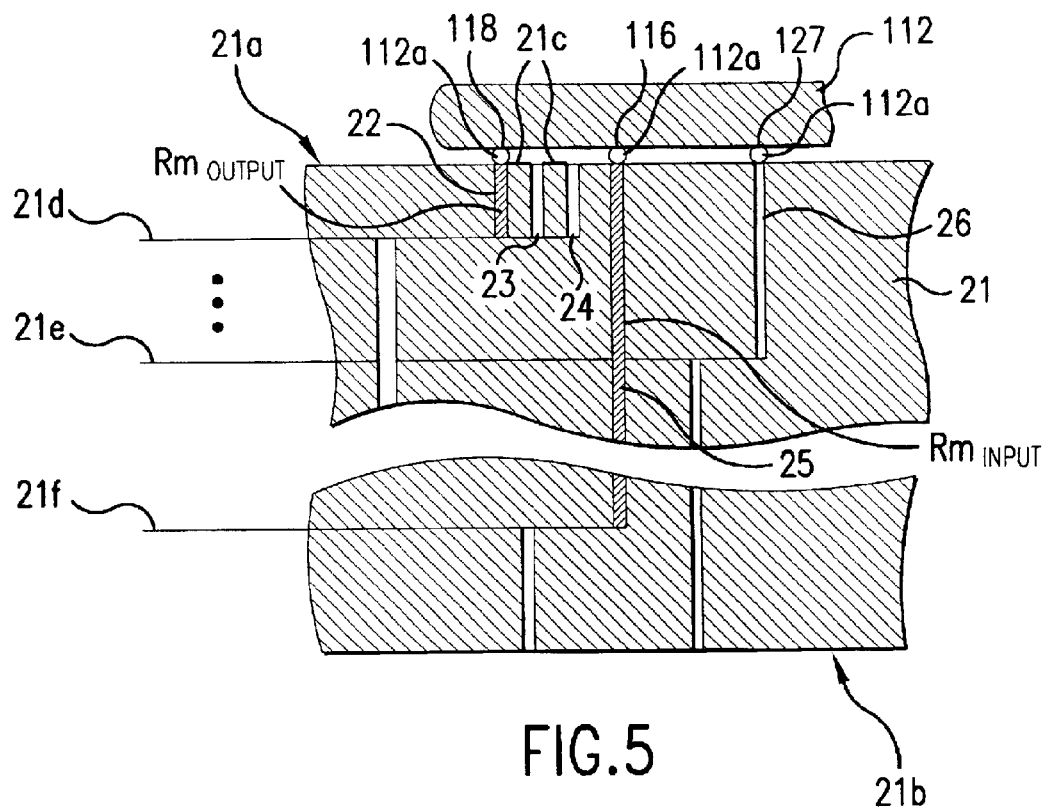
FIG. 5 is a cross-sectional view showing the circuit of FIG. 4 implemented in a circuit package in accordance with the alternate embodiment of the present invention.

Referring to both FIGS. 4 and 5, although the foregoing has been explained with respect to controlling the impedance at output 118, $R_{TOTALDRIVER}$, the same holds true for the impedance at input 116, $R_{INPUT}$, used as a pull-up and termination voltage resistor. To that end, a termination resistor $Rm_{INPUT}$ is connected to both input 116 and a power plane at 21f. Termination resistor $Rm_{INPUT}$ is formed by introducing resistive fill in via 25 and has a value selected so that it matches the characteristic impedance, $Z_0$, of transmission line 114b. This properly terminates a signal arriving at input 116. Additionally, other inputs or ouputs (I/Os) present on driver 112, shown as I/O 127, may be connected to a resistive via, such as 26, in order to achieve impedance matching between I/O 127 and conductive plane 21e. It should be noted that the value of the resistors defined by filling vias 22, 25 and 26 with resistive material may be controlled by varying the dimensions of the vias, employing resistive fill with differing resistivity or both. As a result a great amount of flexibility is provided with not only matching the impedance between driver I/Os, but also ensuring that the resistivity provided by vias 22, 25 and 26, are identical.

Figure 6:
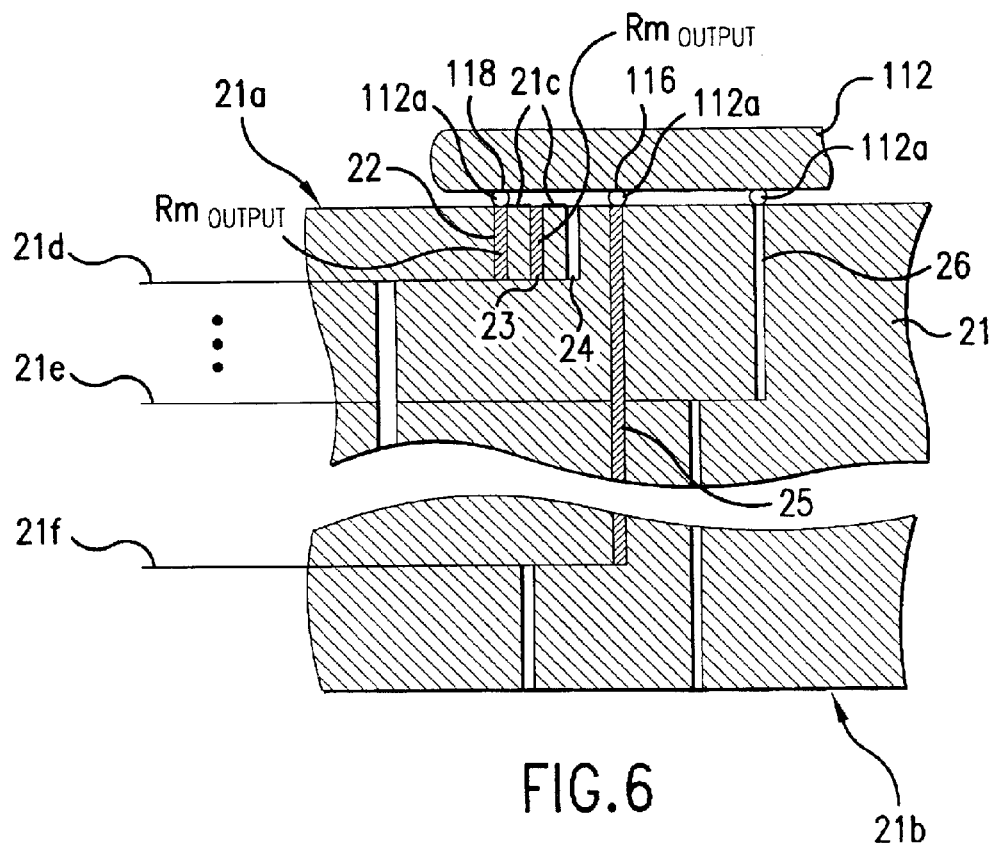
FIG. 6 is a cross-sectional view showing the circuit of FIG. 4 implemented in accordance with a second alternate embodiment of the present invention.

Referring to FIG. 6, were it desired to reduce the resistive component of $R_{TOTALDRIVER}$ without changing the resistive properties of the resistive fill, then via 23 and/or via 24, could be filled with a resistive fill to create an additional resistance by formation of $Rm_{output}'$. Assuming $Rm_{output}$ and $Rm_{output}'$ have substantially similar volumes, this would reduce the resistive component associated With $R_{TOTALDRIVER}$. However, the actual values of $Rm_{output}$ and $Rm_{output}'$ would be selected to avoid impedance mismatches between output 118 and the transmission line.

Although the foregoing has discussed the circuit driver 112 as comprising a buffer, it should be understood that driver circuit 112 may be any type of active circuit known in the electrical arts, such as an inverter, an amplifier and the like. Further, where the foregoing has been described with respect to flip-chip technology, it should be understood that the present invention applies to other packaging designs, e.g., printed circuit boards (PCB). To that end, substrate 21 may be a printed circuit board and conductive bumps 112a may be solder balls. Therefore, the scope of the invention should not be based upon the foregoing description. Rather, the scope of the invention should be determined based upon the claims recited herein, including the full scope of equivalents thereof.

What is claimed is:

1. A circuit package, comprising:
   a dielectric substrate having a first surface and a conductive layer, and a via extending therebetween, with a first conductor disposed on said first surface with said via placing said first conductor and said conductive layer in electrical communication;

a driver circuit mounted to said substrate and including an input and an output, with said output being in electrical communication with said first conductor and having an output resistive component associated therewith, with said via having a resistive fill disposed therein, defining a via resistance connected between said first conductor and and said conductive layer, said output having an output impedance being defined by said output resistive component and said via resistance; and wherein said substrate further includes an additional conductor and an additional via filled with said resistive fill, defining an additional via resistance, said additional conductor being disposed on said first surface, with a second conductive layer being in electrical communication with said additional via with said additional via resistance extending between said additional conductor and said second conductive layer and said input being in electrical communication with said additional conductor and having an input resistance component and an input impedance associated therewith, with said input impedance being defined by said input resistive component and said additional via resistance.

2. A circuit package, comprising:

a dielectric substrate having a first surface and a conductive layer and a via extending therebetween, with a first conductor disposed on said first surface with said via placing said first conductor and said conductive layer in electrical communication;

a driver circuit mounted to said substrate and including an input and an output, with said output being in electrical communication with said first conductor and having an output resistive component associated therewith, with said via having a resistive fill disposed therein, defining a via resistance connected between said first conductor and said conductive layer, said output having an output impedance being defined by said output resistive component and said via resistance; and wherein said substrate includes a plurality of said via, individual ones of a subgroup of said via in electrical communication and extending between said first surface and said conductive layer in parallel and have said resistive fill disposed therein to define said via resistance, with said via resistance being inversely proportional to a number of said plurality of vias in said subgroup.

3. A circuit package, comprising:

a dielectric substrate having a first surface and a conductive layer and a via extending therebetween, with a first conductor disposed on said first surface with said via placing said first conductor and said conductive layer in electrical communication;

a driver circuit mounted to said substrate and including an input and an output, with said output being in electrical communication with said first conductor and having an output resistive component associated therewith, with said via having a resistive fill disposed therein, defining a via resistance connected between said first conductor and and said conductive layer, said output having an output impedance being defined by said output resistive component and said via resistance; and wherein said output resistive component further includes an output resistance of said driver circuit having a magnitude in a range of 5 to 12 ohms, inclusive, with said via resistance having a magnitude in a range of 35 to 50 ohms, inclusive.

4. A circuit package, comprising:

a dielectric substrate having a first surface and a conductive layer and a via extending therebetween, with a first conductor disposed on said first surface with said via placing said first conductor and said conductive layer in electrical communication;

a driver circuit mounted to said substrate and including an input and an output, with said output being in electrical communication with said first conductor and having an output resistive component associated therewith, with said via having a resistive fill disposed therein, defining a via resistance connected between said first conductor and and said conductive layer, said output having an output impedance being defined by said output resistive component and said via resistance; and wherein said via resistance has a magnitude that is at least twice a magnitude of said output resistive component.

5. The circuit package as recited in claim 4 wherein said substrate comprises a printed circuit board.

6. The circuit package as recited in claim 4 wherein said driving circuit is selected from a set of driving circuits consisting of, a buffer, an inverter and an amplifier.

7. The circuit package as recited in claim 4 wherein said output communicates with said first conductor said first conductor including a conductive bump.

8. The package as recited in claim 7 wherein said conductive bump is disposed above said via.

9. The package as recited in claim 8 wherein said conductive bump contacts a conductive trace electrically coupled to said via.

10. A circuit, comprising:

a dielectric substrate having a first surface and a first conductive layer and a second conductive layer, and a plurality of vias extending therebetween, with first and second conductors disposed on said first surface;

a driver circuit mounted to said substrate and including an output having an output resistive component associated therewith, and an input having an input resistive component associated therewith, with said output being in electrical communication with said first conductor and said input being in electrical communication with said second conductor, with a first via of said plurality of vias having a resistive fill disposed therein defining a first via resistance connected between said first conductor and and said first conductive layer and a second via of said plurality of vias having said resistive fill disposed therein defining a second via resistance connected between said second condcutor and said second conductive layer, with said output having an output impedance associated therewith defined by said output resistive component and said first via resistance, with said first via resistance, having a magnitude that is at least twice a magnitude of said output resistive component, with said input having an input impedance associated therewith defined by said input resistive component and said second via resistance, with said second via resistance having a magnitude that is at least twice a magnitude of said input resistive component.

11. The circuit as recited in claim 10 wherein a first subgroup of said plurality of said vias extends between said first surface and said first conductive layer in parallel and have said resistive fill disposed therein to define said first resistance, with said first resistance being inversely proportional to a number of said plurality of vias in said first subgroup.

12. The circuit as recited in claim 11, wherein a second subgroup of said plurality of said vias extends between said first surface and said second conductive layer in parallel and have said resistive fill disposed therein to define said second resistance, with said second resistance being inversely proportional to a number of said plurality of vias in said first subgroup.

13. The circuit recited in claim 12 wherein said input and output resistances of said driver circuit each have a magnitude in a range of 5 to 12 ohms, inclusive, with said first and second resistances having a magnitude in a range of 35 to 50 ohms, inclusive.

14. The circuit as recited in claim 13 wherein said substrate comprises a printed circuit board.

15. The circuit package as recited in claim 14 wherein said driving circuit is selected from a set of driving circuits consisting of, a buffer, an inverter and an amplifier.

16. A method of establishing an impedance of a circuit package, said method comprising:
attaching a circuit driver to a dielectric substrate having a first surface and a conductive layer, and a via extending therebetween, with a first conductor disposed on said first surface, with said via placing said first conductor and said conductive layer in electrical communication, with said driver circuit including an input and an output, with said output being in electrical communication with said first conductor and having an output impedance associated therewith that includes an output resistive component and an output reactance component; and
filling said via with a resistive fill to define a resistance connected between said first conductor and said conductive layer, with said resistance being of sufficient magnitude to define a dominant component of said output impedance.

17. The method as recited in claim 16 further including adjusting said output resistance by connecting additional via between said first surface and said conductive layer and filling said additional via with said resistive fill to create a plurality of resistive vias connected in parallel between said first conductor and second said conductive layer, with said first resistance being inversely proportional to a number of said plurality of said resistive vias.

18. The method as recited in claim 16 wherein attaching said circuit driver further includes connecting said output to said first conductor at a region positioned spaced-apart from said via, with a length of said first conductor extending between said via and said region defining an interval having a resistance associated therewith, defining an interval resistance, with said output resistive component further including an output resistance of said driver circuit and said interval resistance, with said resistance having a magnitude at least twice a magnitude of said output resistance and said interval resistance, combined.

19. The method as recited in claim 16 further including connecting said input to an additional conductor disposed on said first surface of said substrate that is connected to an additional via, with said additional via extending from said additional conductor to a second conductive layer and filling said additional via with said resistive fill to define an additional resistance connected between said additional conductor and said second conductive layer with input resistive component including said additional resistance and being a dominant component of said input impedance.

20. The method as recited in claim 19 further including adjusting said input resistance by connecting an additional via between said additional end conductor and said second conductive layer and filling said additional via with said resistive fill to create a plurality of resistive vias connected in parallel between said additional conductor and said second conductive layer with said additional resistance being inversely proportional to a number of said plurality of said resistive vias.

21. The method as recited in claim 19 wherein attaching said circuit further includes connecting said input to said additional conductor at a region positioned spaced-apart from said additional via, with a length of said additional conductor extending between said additional via and said region defining an interval having a resistance associated therewith, defining an interval resistance, with said input resistive component further including an input resistance of said driver circuit and said interval resistance, with said additional resistance having a magnitude at least twice a magnitude of said input resistance and said interval resistance, combined.

22. A package comprising:
a dielectric substrate having a first surface and a conductive layer, and a via extending therebetween, with a first conductor disposed on said first surface, with said via placing said first conductor and said conductive layer in electrical communication;
a circuit mounted to said substrate and including an input and an output, with said output being in electrical communication with said first conductor and having an output resistive component associated therewith, with said via having a resistive fill disposed therein, defining a via resistance connected between said first conductor and said conductive layer, said output having an output impedance being defined at least in part by said output resistive component and said via resistance; and
wherein said conductor includes a conductive bump.

23. The package as recited in claim 22 wherein said conductive bump is disposed above said via.

24. The package as recited in claim 23 wherein said conductive bump is coupled to a conductive trace.

25. The package as recited in claim 24 wherein said substrate includes a plurality of said via, individual ones of a subgroup of said plurality of via are coupled to the conductive trace and extend between said first surface and said conductive layer in parallel and have said resistive fill disposed therein to define said via resistance, with said via resistance being inversely proportional to a number of said plurality of vias in said subgroup.

26. A package comprising:
a dielectric substrate having first surface and a first and second conductor layers, having a first resistive via electrically coupling a first conductor on said first surface to said first conductor layer, and having a second resistive via electrically coupling a second conductor on said first surface to the second conductor layer, said first and second vias having a resistive fill disposed therein and respectively having a first and second via resistance;
a circuit mounted to said dielectric substrate and including an output having an output resistive component, and including an input having an input resistive component, said output being in electrical communication with said first conductor, and said input being in electrical communication with said second conductor,
wherein an output impedance associated with said output is substantially defined by said output resistive component and said first via resistance; and
wherein an input impedance associated with said input is substantially defined by said input resistive component and said second via resistance.

27. The package as recited in claim 26 wherein said substrate includes a plurality of said first via, a subgroup of which extends between said first surface and said first conductive layer in parallel and have said resistive fill disposed therein to define said first via resistance, with said first via resistance being inversely proportional to a number of said plurality of vias in said subgroup.

28. The package as recited in claim 26 wherein:
said output communicates with said first conductor, said first conductor including a first conductive bump disposed above said first via; and
said input communicates with said second conductor, said second conductor including a second conductive bump disposed above said second via.

29. The package as recited in claim 26 wherein said input communicates with said second conductor, said second conductor including a second conductive bump.

30. The package as recited in claim 29 wherein said second conductive bump is disposed above said via.

31. The package as recited in claim 26 wherein said output communicates with said first conductor, said first conductor including a first conductive bump.

32. The package as recited in claim 31 wherein said first conductive bump is disposed above said first via.

33. The package as recited in claim 31 wherein said first conductive bump contacts a conductive trace.

* * * * *

UNITED STATES PATENT AND TRADEMARK OFFICE
CERTIFICATE OF CORRECTION

PATENT NO. : 6,737,749 B2
DATED : May 18, 2004
INVENTOR(S) : Nayon Tomsio and Avi Liebermensch It is certified that error appears in the above-identified patent and that said Letters Patent is hereby corrected as shown below:

Column 4,
Line 8, the words "output match resistor output" should read -- output match resistor $Rm_{output}$ --

Column 7,
Line 15, the words "The circuit package as recited in claim 14" should read -- The circuit as recited in claim 14 --.
Line 41, the words "and second said conductive layer" should read -- and said conductive layer --.

Signed and Sealed this

Sixteenth Day of November, 2004

JON W. DUDAS
*Director of the United States Patent and Trademark Office*